(12) United States Patent
Verma et al.

(10) Patent No.: US 12,046,659 B2
(45) Date of Patent: Jul. 23, 2024

(54) SEMICONDUCTOR STRUCTURE AND MANUFACTURING METHOD THEREOF

(71) Applicant: United Microelectronics Corp., Hsinchu (TW)

(72) Inventors: Purakh Raj Verma, Singapore (SG); Su Xing, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 268 days.

(21) Appl. No.: 17/724,511

(22) Filed: Apr. 20, 2022

(65) Prior Publication Data

US 2023/0299174 A1    Sep. 21, 2023

(30) Foreign Application Priority Data

Mar. 18, 2022 (CN) .......................... 202210271116.3

(51) Int. Cl.
| | |
|---|---|
| *H01L 29/66* | (2006.01) |
| *H01L 21/768* | (2006.01) |
| *H01L 23/528* | (2006.01) |
| *H01L 29/06* | (2006.01) |
| *H01L 29/737* | (2006.01) |

(52) U.S. Cl.
CPC .. *H01L 29/66242* (2013.01); *H01L 21/76898* (2013.01); *H01L 23/5283* (2013.01); *H01L 29/0649* (2013.01); *H01L 29/737* (2013.01)

(58) Field of Classification Search
CPC ........... H01L 29/66242; H01L 29/0649; H01L 29/737; H01L 29/1004; H01L 29/7371; H01L 21/76898; H01L 23/5283; H01L 23/66; H01L 25/0657
See application file for complete search history.

(56) References Cited

U.S. PATENT DOCUMENTS

| | | | | |
|---|---|---|---|---|
| 6,033,925 | A * | 3/2000 | Han | H01L 21/76251 |
| | | | | 257/E21.216 |
| 6,830,967 | B1 * | 12/2004 | Yin | H01L 21/8249 |
| | | | | 438/366 |
| 9,431,368 | B2 | 8/2016 | Enquist et al. | |
| 10,991,631 | B2 * | 4/2021 | Preisler | H01L 27/1203 |
| 11,152,485 | B2 | 10/2021 | Verma et al. | |
| 11,355,617 | B2 * | 6/2022 | Dutta | H01L 29/41708 |
| 2013/0277753 | A1 * | 10/2013 | Clark, Jr. | H01L 27/1203 |
| | | | | 438/234 |
| 2019/0341381 | A1 * | 11/2019 | Dutta | H01L 29/93 |
| 2020/0266290 | A1 * | 8/2020 | Dutta | H01L 29/36 |

* cited by examiner

*Primary Examiner* — Dao H Nguyen
(74) *Attorney, Agent, or Firm* — JCIPRNET

(57) ABSTRACT

A semiconductor structure includes following components. A first substrate has a first surface and a second surface opposite to each other. An HBT device is located on the first substrate and includes a collector, a base, and an emitter. A first interconnect structure is electrically connected to the base, located on the first surface, and extends to the second surface. A second interconnect structure is electrically connected to the emitter, located on the first surface, and extends to the second surface. A third interconnect structure is located on the second surface and electrically connected to the collector. An MOS transistor device is located on a second substrate and includes a gate, a first source and drain region, and a second source and drain region. Interconnect structures on the second substrate electrically connect the base to the first source and drain region and electrically connect the emitter to the gate.

20 Claims, 5 Drawing Sheets

SEMICONDUCTOR STRUCTURE AND MANUFACTURING METHOD THEREOF

CROSS-REFERENCE TO RELATED APPLICATION

This application claims the priority benefit of China patent application serial no. 202210271116.3, filed on Mar. 18, 2022. The entirety of the above-mentioned patent application is hereby incorporated by reference herein and made a part of this specification.

BACKGROUND

Technical Field

The disclosure relates to a semiconductor structure and a manufacturing method thereof; more particularly, the disclosure relates to a semiconductor structure with a favorable overall performance and a manufacturing method thereof.

Description of Related Art

In some applications of semiconductor structures, a variety of semiconductor devices may be integrated in one semiconductor structure. For instance, the semiconductor structure may have a radio frequency front-end module (RF FEM), a radio frequency (RF) switch, a low-noise amplifier (LNA), and a power amplifier (PA) which are integrated into the semiconductor structure. Hence, how to improve the overall performance of the semiconductor structure has become an important direction at present.

SUMMARY

The disclosure provides a semiconductor structure and a manufacturing method thereof which may improve the overall performance of the semiconductor structure.

In an embodiment of the disclosure, a semiconductor structure is provided, and the semiconductor structure includes a first substrate, a heterojunction bipolar transistor (HBT) device, a first interconnect structure, a second interconnect structure, a third interconnect structure, a second substrate, a metal oxide semiconductor (MOS) device, and a plurality of interconnect structures. The first substrate has a first surface and a second surface opposite to each other. The HBT device is located on the first substrate and includes a collector, a base, and an emitter. The first interconnect structure is electrically connected to the base, and the first interconnect structure is located on the first surface and extends to the second surface. The second interconnect structure is electrically connected to the emitter, and the second interconnect structure is located on the first surface and extends to the second surface. The third interconnect structure is located on the second surface and electrically connected to the collector. The MOS transistor device is located on the second substrate and includes a gate, a first source and drain region, and a second source and drain region. The interconnect structures are located on the second substrate, and the interconnect structures electrically connect the base to the first source and drain region and electrically connect the emitter to the gate.

According to an embodiment of the disclosure, the collector may extend from the first surface to the second surface.

According to an embodiment of the disclosure, the first interconnect structure may be connected to the base on the first surface.

According to an embodiment of the disclosure, the second interconnect structure may be connected to the emitter on the first surface.

According to an embodiment of the disclosure, the third interconnect structure may be connected to the collector on the second surface.

According to an embodiment of the disclosure, the interconnect structures may include a fourth interconnect structure and a fifth interconnect structure. The fourth interconnect structure is electrically connected to the first source and drain region. The fifth interconnect structure is electrically connected to the gate. The base and the first source and drain region are electrically connected to each other by the first interconnect structure and the fourth interconnect structure bonded to each other. The emitter and the gate are electrically connected to each other by the second interconnect structure and the fifth interconnect structure bonded to each other.

According to an embodiment of the disclosure, the first interconnect structure may be directly bonded to the fourth interconnect structure, and the second interconnect structure may be directly bonded to the fifth interconnect structure.

According to an embodiment of the disclosure, the semiconductor structure may further include a first dielectric layer and a second dielectric layer. The first dielectric layer is located on the first substrate, and a portion of the first interconnect structure and a portion of the second interconnect structure may be located in the first dielectric layer. The second dielectric layer is located on the second substrate, and the fourth interconnect structure and the fifth interconnect structure may be located in the second dielectric layer.

According to an embodiment of the disclosure, the first dielectric layer and the second dielectric layer are bonded to each other.

According to an embodiment of the disclosure, the first dielectric layer may be directly bonded to the second dielectric layer.

According to an embodiment of the disclosure, the interconnect structures may further include a sixth interconnect structure that is electrically connected to the second source and drain region.

According to an embodiment of the disclosure, the second substrate may be a semiconductor-on-insulator (SOI) substrate.

According to an embodiment of the disclosure, the semiconductor structure may further include an isolation structure that is located in the first substrate. The first interconnect structure may pass through the isolation structure, and the second interconnect structure may pass through the isolation structure.

According to an embodiment of the disclosure, the semiconductor structure may further include a dielectric layer, a passivation layer, a fourth interconnect structure, a fifth interconnect structure, and a sixth interconnect structure. The dielectric layer is located on the second surface. The third interconnect structure is located in the dielectric layer. The passivation layer is located on the dielectric layer. The fourth interconnect structure is located in the passivation layer and electrically connected to the first interconnect structure. The fifth interconnect structure is located in the passivation layer and electrically connected to the second interconnect structure. The sixth interconnect structure is located in the passivation layer and electrically connected to the third interconnect structure.

According to an embodiment of the disclosure, the passivation layer may have a first opening, a second opening, and a third opening. The first opening exposes the fourth interconnect structure. The second opening exposes the fifth interconnect structure. The third opening exposes the sixth interconnect structure.

In an embodiment of the disclosure, a manufacturing method of a semiconductor structure is provided, and the manufacturing method includes following steps. A first substrate is provided, and the first substrate has a first surface and a second surface opposite to each other. A HBT device is formed on the first substrate, and the HBT device includes a collector, a base, and an emitter. A first interconnect structure is formed on the first surface, and the first interconnect structure is electrically connected to the base and extends to the second surface. A second interconnect structure is formed on the first surface, and the second interconnect structure is electrically connected to the emitter and extends to the second surface. A third interconnect structure is formed on the second surface, and the third interconnect structure is electrically connected to the collector. A second substrate is provided. A MOS transistor device is formed on the second substrate, and the MOS transistor device includes a gate, a first source and drain region, and a second source and drain region. A plurality of interconnect structures are formed on the second substrate, and the interconnect structures electrically connect the base to the first source and drain region and electrically connect the emitter to the gate.

According to an embodiment of the disclosure, a method of forming the interconnect structures may include following steps. A fourth interconnect structure is formed, and a fifth interconnect structure is formed. The fourth interconnect structure is electrically connected to the first source and drain region, and the fifth interconnect structure is electrically connected to the gate.

According to an embodiment of the disclosure, the manufacturing method of the semiconductor structure may further include following steps. The first interconnect structure and the fourth interconnect structure are bonded, and the base is electrically connected to the first source and drain region. The second interconnect structure and the fifth interconnect structure are bonded, and the emitter is electrically connected to the gate.

According to an embodiment of the disclosure, the manufacturing method of the semiconductor structure may further include following steps. A first dielectric layer is formed on the first substrate, and a portion of the first interconnect structure and a portion of the second interconnect structure may be located in the first dielectric layer. A second dielectric layer is formed on the second substrate, and the fourth interconnect structure and the fifth interconnect structure may be located in the second dielectric layer. The first dielectric layer and the second dielectric layer are bonded.

According to an embodiment of the disclosure, a method of bonding the first interconnect structure and the fourth interconnect structure, bonding the second interconnect structure and the fifth interconnect structure, and bonding the first dielectric layer and the second dielectric layer may be hybrid bonding.

In view of the above, in the semiconductor structure and the manufacturing method thereof provided in one or more embodiments of the disclosure, the semiconductor structure includes the HBT device located on the first substrate and the MOS transistor device located on the second substrate. The base is electrically connected to the first source and drain region, and the emitter is electrically connected to the gate. Hence, the HBT device and the MOS transistor device may be stacked and electrically connected to each other, whereby the size of the semiconductor structure may be effectively reduced.

Besides, the first interconnect structure, the second interconnect structure, and the third interconnect structure are electrically connected to the base, the emitter, and the collector, respectively. The first interconnect structure is located on the first surface and extends to the second surface, the second interconnect structure is located on the first surface and extends to the second surface, and the third interconnect structure is located on the second surface. Accordingly, the size of the HBT device may be reduced, and the resistance of the collector, the capacitance between the collector and the first substrate, the capacitance between the first interconnect structure and the third interconnect structure, and the capacitance between the second interconnect structure and the third interconnect structure may be reduced as well. As such, the performance of the HBT device and the overall performance of the semiconductor structure may be enhanced.

From another perspective, the HBT device and the MOS transistor device may be respectively formed on the first substrate and the second substrate, and therefore the manufacturing process of the HBT device and the MOS transistor device do not affect each other. As a result, the HBT device and the MOS transistor device may be respectively adjusted to the optimal condition, so as to further enhance the performance of the HBT device, the performance of the MOS transistor device, and the overall performance of the semiconductor structure.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

FIG. 1A to FIG. 1E are cross-sectional views of a manufacturing process of a semiconductor structure according to some embodiments of the disclosure.

Figure 1A:
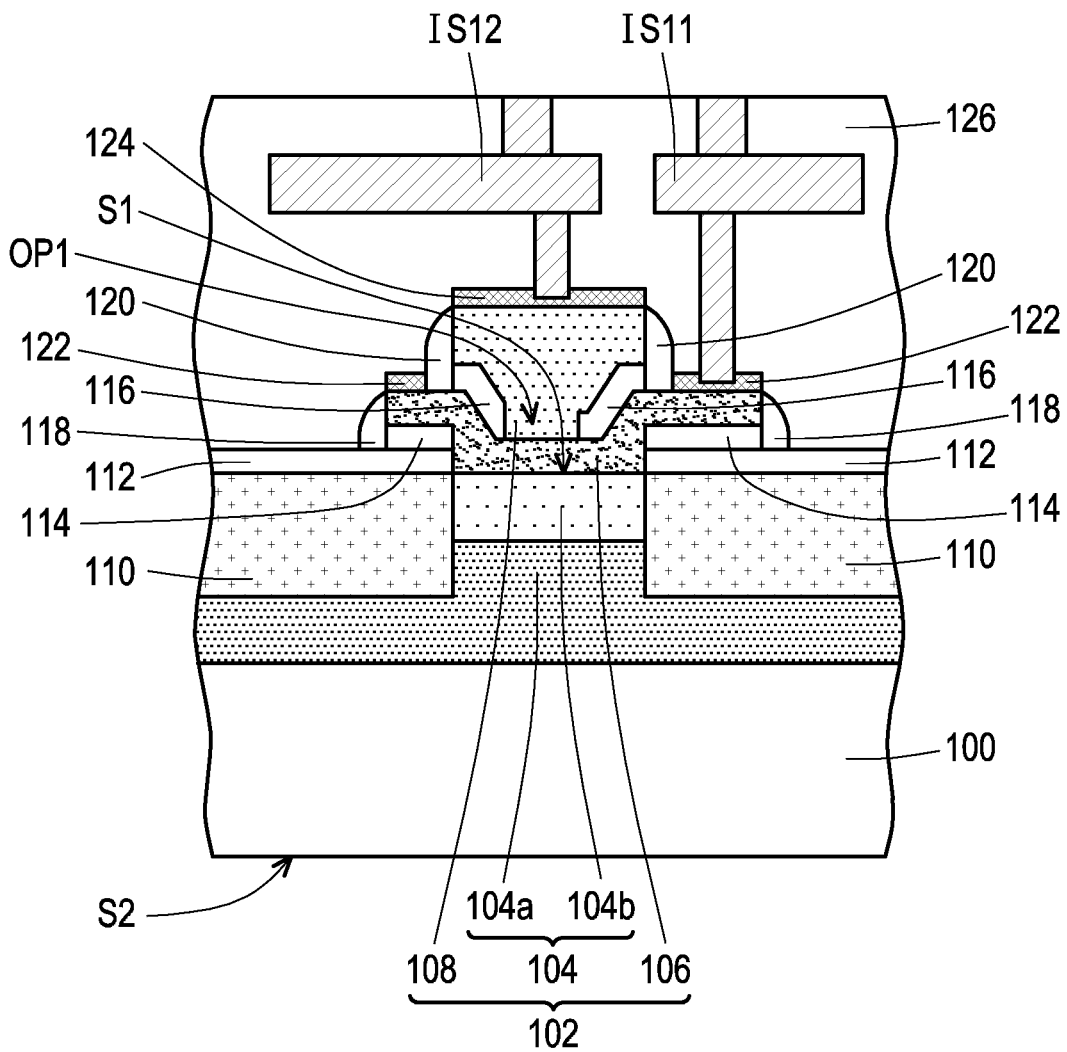
FIG. 1A to FIG. 1E are cross-sectional views of a manufacturing process of a semiconductor structure according to some embodiments of the disclosure.

With reference to FIG. 1A, a substrate 100 is provided. The substrate 100 has a first surface S1 and a second surface S2 opposite to each other. In some embodiments, the substrate 100 may have a first conductive type (e.g., a p-type). The first conductive type and a second conductive type indicated hereinafter may respectively refer to the p-type and an n-type or vice versa. In this embodiment, the first conductive type is, for instance, the p-type, and the second conductive type is, for instance, the n-type, which should however not be construed as a limitation in the disclosure. In other embodiments, the first conductive type may be the n type, and the second conductive type may be the p type. The substrate 100 may be a semiconductor substrate, such as a silicon substrate.

Next, an HBT device 102 is formed on the substrate 100. The HBT device 102 includes a collector 104, a base 106, and an emitter 108. The collector 104 is located in the substrate 100. The collector 104 may have the second conductive type (e.g., the n-type). In some embodiments, the collector 104 may include a heavily doped region 104a and a lightly doped region 104b. The heavily doped region 104a is located in the substrate 100. The lightly doped region 104b is located in the substrate 100 and located between the heavily doped region 104a and the base 106.

The base 106 is located on the substrate 100 and may be connected to the collector 104. The base 106 may have the first conductive type (e.g., the p-type). A material of the base 106 may be a doped semiconductor material, such as a doped group III-V semiconductor material. In this embodiment, the material of base 106 is, for instance, doped SiGe, which should however not be construed as a limitation in the disclosure.

The emitter 108 is located on the base 106. The emitter 108 may have the second conductive type (e.g., the n-type). A material of the emitter 108 is, for instance, a doped semiconductor material. In this embodiment, the material of the emitter 108 is, for instance, doped polysilicon, which should however not be construed as a limitation in the disclosure.

In some embodiments, an isolation structure 110 may be formed in the substrate 100. The isolation structure 110 is, for instance, a shallow trench isolation structure. A material of the isolation structure 110 is, for instance, silicon oxide. In some embodiments, a passivation layer 112 may be formed on the isolation structure 110. A material of the passivation layer 112 is, for instance, silicon oxide. In some embodiments, a passivation layer 114 may be formed between the base 106 and the passivation layer 112. A material of the passivation layer 114 is, for instance, polysilicon. In some embodiments, a passivation layer 116 may be formed between the emitter 108 and the base 106. The passivation layer 116 has an opening OP1. A material of the passivation layer 116 is, for instance, silicon oxide. In some embodiments, the emitter 108 passes through the opening OP1 of the passivation layer 116 and connects the base 106.

In some embodiments, a spacer 118 and a spacer 120 may be formed on a sidewall of the base 106 and a sidewall of the emitter 108, respectively. A material of the spacer 118 and the spacer 120 is, for instance, silicon oxide. In some embodiments, a metal silicide layer 122 and a metal silicide layer 124 may be formed on the base 106 and the emitter 108, respectively. A material of the metal silicide layer 122 and the metal silicide layer 124 is, for instance, cobalt silicide or nickel silicide.

In addition, an interconnect structure IS11 is formed on the first surface S1 of the substrate 100. The interconnect structure IS11 is electrically connected to the base 106. In some embodiments, the interconnect structure IS11 may be electrically connected to the base 106 via the metal silicide layer 122. In addition, an interconnect structure IS12 is formed on the first surface S1 of the substrate 100. The interconnect structure IS12 is electrically connected to the emitter 108. In some embodiments, the interconnect structure IS 12 may be electrically connected to the emitter 108 via the metal silicide layer 124. The interconnect structure IS11 and the interconnect structure IS12 may respectively include a contact, a via, a conductive line, or a combination thereof. The interconnect structure IS11 and the interconnect structure IS12 may be multi-layer interconnect structures. A material of the interconnect structure IS11 and the interconnect structure IS12 is, for instance, tungsten, copper, aluminum, or a combination thereof. The interconnect structure IS11 and the interconnect structure IS12 may be formed by a metal interconnection process.

Moreover, a dielectric layer 126 may be formed on the substrate 100. The interconnect structure IS11 and the interconnect structure IS12 may be located in the dielectric layer 126. In some embodiments, the dielectric layer 126 may have a multi-layer structure. A material of the dielectric layer 126 is, for instance, silicon oxide. A method of forming the dielectric layer 126 is, for instance, chemical vapor deposition (CVD).

Figure 1B:
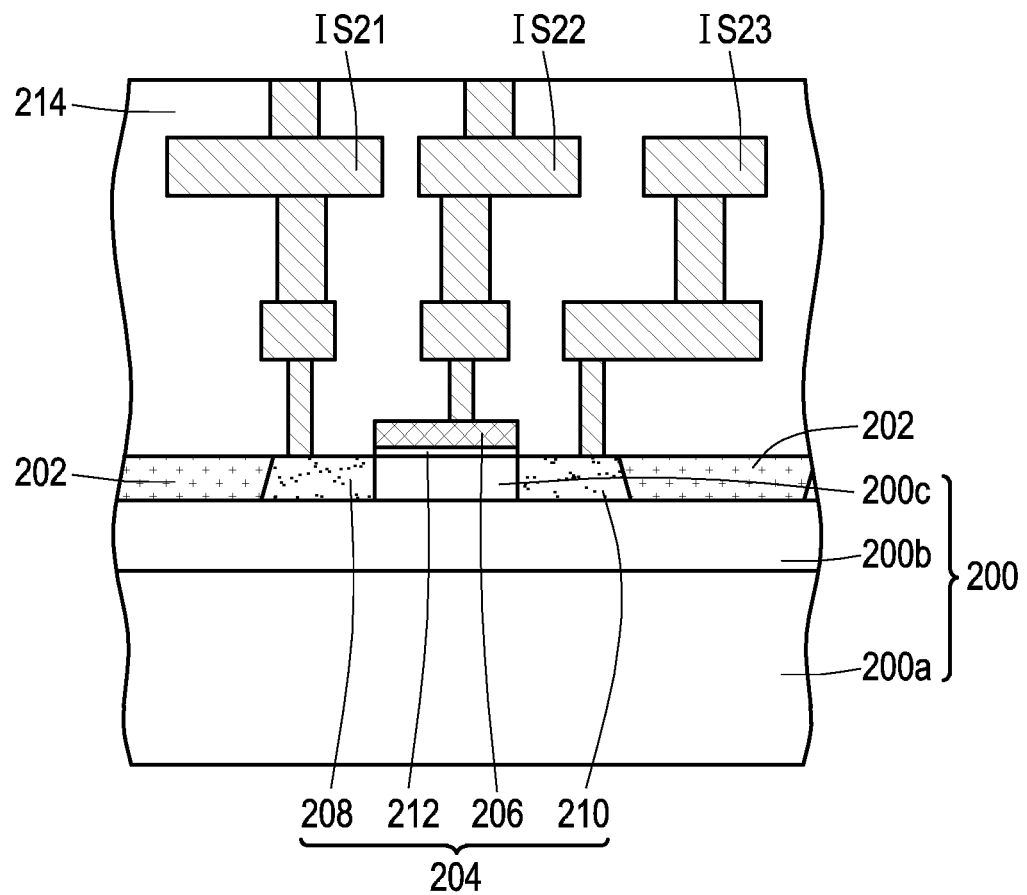

With reference to FIG. 1B, a substrate 200 is provided. In some embodiments, the substrate 200 may be an SOI substrate. For instance, the substrate 200 may include a substrate layer 200a, an insulation layer 200b, and a semiconductor layer 200c. A material of the substrate layer 200a is, for instance, a semiconductor material, such as silicon. The insulation layer 200b is located on the substrate layer 200a. A material of the insulation layer 200b is, for instance, silicon oxide. The semiconductor layer 200c is located on the insulation layer 200b. A material of the semiconductor layer 200c is, for instance, silicon. In some embodiments, an isolation structure 202 may be formed in the substrate 200. The isolation structure 202 is, for instance, a shallow trench isolation structure. A material of the isolation structure 202 is, for instance, silicon oxide.

Next, an MOS transistor device 204 is formed on the substrate 200. In this embodiment, although only one MOS transistor device 204 is formed on substrate 200, this should not be construed as a limitation in the disclosure. In some embodiments, plural MOS transistor devices 204 may be formed on substrate 200. The MOS transistor device 204 may be an n-type MOS (NMOS) transistor or a p-type MOS (PMOS) transistor. In some embodiments, a complementary metal oxide semiconductor (CMOS) device may be formed on substrate 200. That is, in case that a plurality of MOS transistor devices 204 are formed on the substrate 200, the MOS transistor devices 204 may include the NMOS transistors and the PMOS transistors.

The MOS transistor device 204 includes a gate 206, a source and drain region 208, and source and drain region 210. A gate 206 is located on the semiconductor layer 200c. A material of gate 206 is, for instance, doped polysilicon. The source and drain region 208 and the source and drain region 210 are located in the semiconductor layer 200c on both sides of the gate 206. The source and drain region 208 and the source and drain region 210 may be a doped region, respectively. In some embodiments, the source and drain region 208 may be a source region, and the source and drain region 210 may be a drain region. In other embodiments, the source and drain region 208 may be the drain region, and the source and drain region 210 may be the source region. In addition, the MOS transistor device 204 may further include a gate dielectric layer 212. The gate dielectric layer 212 is located between the gate 206 and the semiconductor layer 200c. A material of the gate dielectric layer 212 is, for instance, silicon oxide.

Next, a plurality of interconnect structures are formed on the substrate 200. In some embodiments, a method of forming the interconnect structures may include a step of forming the interconnect structure IS21 and a step of forming the interconnect structure IS22. The interconnect structure IS21 is electrically connected to the source and drain region 208. The interconnect structure IS22 is electrically connected to the gate 206. In addition, the method of forming the interconnect structures may further include a step of forming an interconnect structure IS23. The interconnect structure IS22 is electrically connected to the source and drain region 210. The interconnect structure IS21, the interconnect structure IS22, and the interconnect structure IS23 may respectively include a contact window, a via, a conductive line, or a combination thereof. The interconnect structure IS21, the interconnect structure IS22, and the interconnect structure IS23 may be multi-layer interconnect structures. A material of the interconnect structure IS21, the interconnect structure IS22, and the interconnect structure IS23 is, for instance, tungsten, copper, aluminum, or a combination thereof. The interconnect structure IS21, the interconnect structure IS22, and the interconnect structure IS23 may be formed by a metal interconnection process.

A dielectric layer 214 may be further formed on the substrate 200. The interconnect structure IS21, the interconnect structure IS22, and the interconnect structure IS23 may be located in the dielectric layer 214. In some embodiments, the dielectric layer 214 may have a multi-layer structure. A material of the dielectric layer 214 is, for instance, silicon oxide. A method of forming the dielectric layer 214 is, for instance, CVD.

Figure 1C:
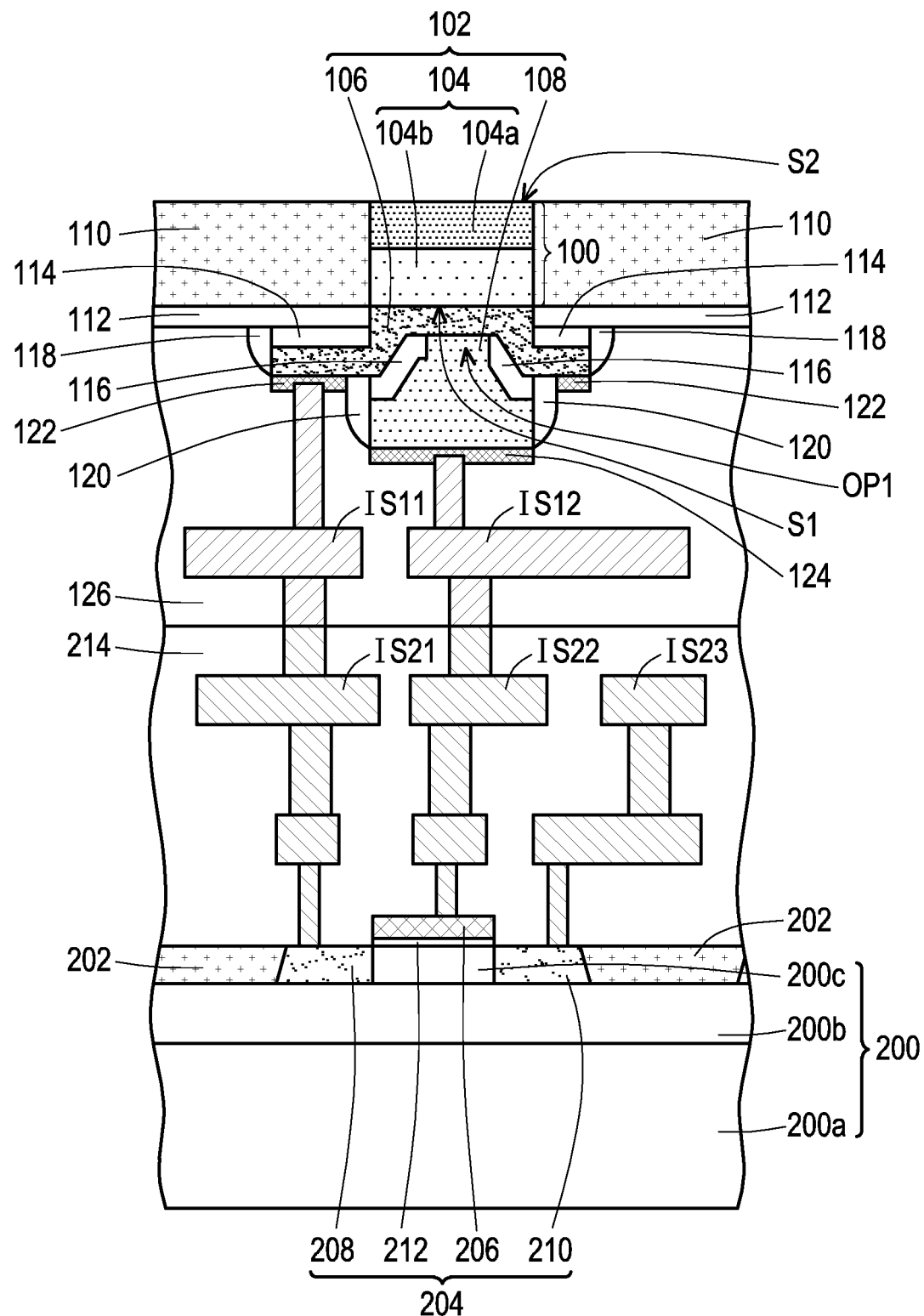

With reference to FIG. 1C, the interconnect structure IS11 and the interconnect structure IS21 may be bonded, and the base 106 may be electrically connected to the source and drain region 208. In addition, the interconnect structure IS12 and the interconnect structure IS22 may be bonded, and the emitter 108 may be electrically connected to the gate 206. That is, the interconnect structures (e.g., the interconnect structure IS21 and the interconnect structure IS22) electrically connect the base 106 to the source and drain region 208 and electrically connect the emitter 108 to the gate 206. In addition, the dielectric layer 126 and the dielectric layer 214 may be bonded. In some embodiments, a method of bonding the interconnect structure IS11 and the interconnect structure IS21, bonding the interconnect structure IS12 and the interconnect structure IS22, and bonding the dielectric layer 126 and the dielectric layer 214 may be hybrid bonding.

Next, a portion of the substrate 100 may be removed to thin down the substrate 100 and expose the isolation structure 110. A method of removing the portion of the substrate 100 is, for instance, chemical mechanical polishing.

Figure 1D:
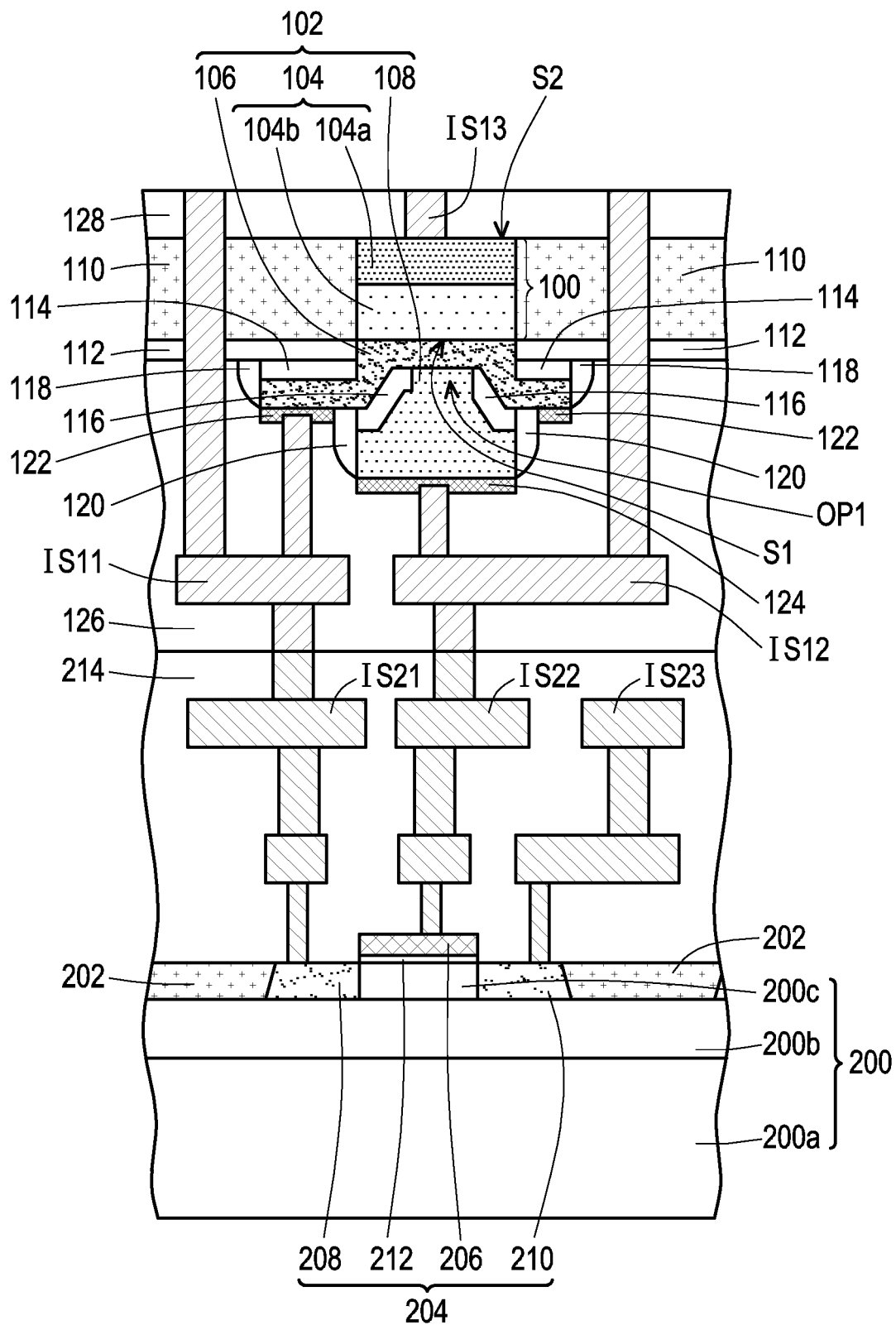

With reference to FIG. 1D, the interconnect structure IS13 is formed on the second surface S2. The interconnect structure IS13 is electrically connected to the collector 104. The interconnect structure IS13 may include a contact, a via, a conductive line, or a combination thereof. In this embodiment, the interconnect structure IS13 is, for instance, the contact, which should however not be construed as a limitation in the disclosure. A material of the interconnect structure IS13 is, for instance, tungsten, copper, aluminum, or a combination thereof. The interconnect structure IS13 may be formed by a metal interconnection process.

In addition, a dielectric layer 128 may be formed on the second surface S2 of the substrate 100. The interconnect structure IS13 is located in the dielectric layer 128. A material of the dielectric layer 128 is, for instance, silicon oxide. Besides, the interconnect structure IS11 extends to the second surface S2 of the substrate 100, and the interconnect structure IS12 extends to the second surface S2 of the substrate 100. In some embodiments, the interconnect structure IS11 and the interconnect structure IS12 may be extended to the second surface S2 of the substrate 100 through a metal interconnection process.

Figure 1E:
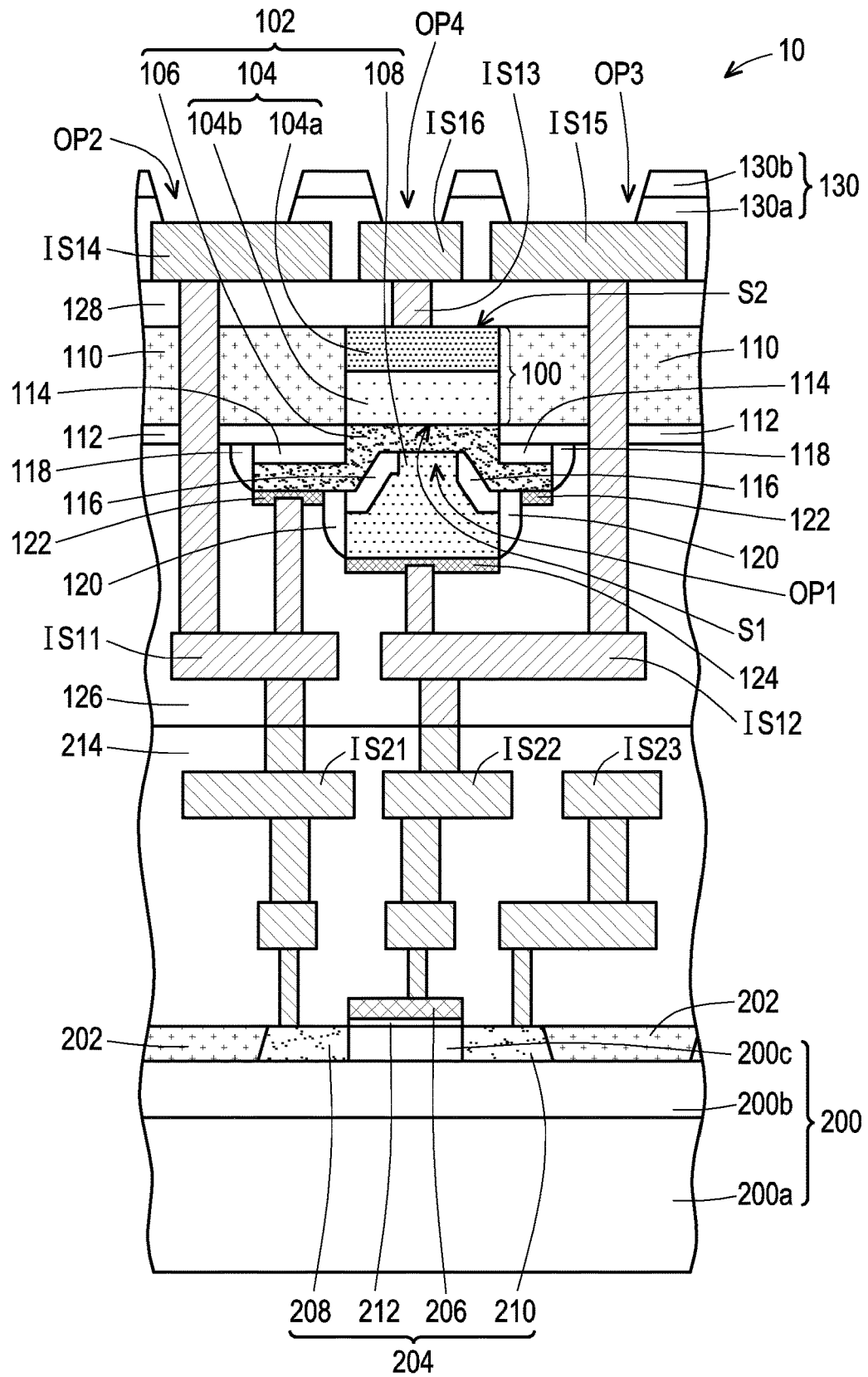

With reference to FIG. 1E, an interconnect structure IS14, an interconnect structure IS 15, and an interconnect structure IS16 that are respectively electrically connected to the interconnect structure IS11, the interconnect structure IS12, and the interconnect structure IS13 may be formed. The interconnect structure IS14, the interconnect structure IS 15, and the interconnect structure IS16 may be a pad or a redistribution layer (RDL), respectively. A material of the interconnect structure IS14, the interconnect structure IS 15, and the interconnect structure IS16 is, for instance, tungsten, copper, aluminum, or a combination thereof. The interconnect structure IS14, the interconnect structure IS 15, and the interconnect structure IS16 may be formed by a metal interconnection process.

Additionally, a passivation layer 130 may be formed on the dielectric layer 128. The passivation layer 130 may cover a portion of the interconnect structure IS14, a portion of the interconnect structure IS 15, and a portion of the interconnect structure IS16. The passivation layer 130 may have an opening OP2, an opening OP3, and an opening OP4. The opening OP2 exposes the interconnect structure IS14. The opening OP3 exposes the interconnect structure IS 15. The opening OP4 exposes the interconnect structure IS16. The passivation layer 130 may have a single-layer structure or a multi-layer structure. For instance, the passivation layer 130 may include a passivation layer 130a and a passivation layer 130b. The passivation layer 130a is located on the dielectric layer 128. A material of the passivation layer 130a is, for instance, silicon oxide. The passivation layer 130b is located on the passivation layer 130a. A material of the passivation layer 130a is, for instance, silicon nitride.

In addition, the number of layers of the interconnect structure IS11 to the interconnect structure IS16 and the interconnect structure IS21 to the interconnect structure IS23 is not limited to the number of layers shown in the drawings. People having ordinary skill in the pertinent art may adjust the number of layers of the interconnect structure IS11 to the interconnect structure IS16 and the interconnect structure IS21 to the interconnect structure IS23 according to actual requirements.

Hereinafter, a semiconductor structure 10 provided in this embodiment is described with reference to FIG. 1E. Besides, although a method of forming the semiconductor structure 10 is explained by taking the above-mentioned method as an example, this should not be construed as a limitation in the disclosure.

With reference to FIG. 1E, the semiconductor structure 10 includes the substrate 100, the HBT device 102, the interconnect structure IS11, the interconnect structure IS12, the interconnect structure IS13, the substrate 200, the MOS transistor device 204, and a plurality of interconnect structures (e.g., the interconnect structure IS21 and the interconnect structure IS22). The substrate 100 has the first surface S1 and the second surface S2 opposite to each other. The substrate 200 may be an SOI substrate. The semiconductor structure 10 may further include the isolation structure 110. The isolation structure 110 is located in the substrate 100.

The HBT device 102 is located on the substrate 100. The HBT device 102 includes the collector 104, the base 106, and the emitter 108. The collector 104 may extend from the first surface S1 to the second surface S2. The interconnect structure IS11 is electrically connected to the base 106. The interconnect structure IS11 is located on the first surface S1 and extends to the second surface S2. In some embodiments, the interconnect structure IS11 may be connected to the base 106 on the first surface S1. The interconnect structure IS11 may pass through the isolation structure 110. The interconnect structure IS12 is electrically connected to the emitter 108. The interconnect structure IS12 is located on the first surface S1 and extends to the second surface S2. In some embodiments, the interconnect structure IS12 may be connected to the emitter 108 on the first surface S1. The interconnect structure IS12 may pass through the isolation structure 110. The interconnect structure IS13 is located on the second surface S2 and is electrically connected to the collector 104. In some embodiments, the interconnect structure IS13 may be connected to the collector 104 on the second surface S2.

The MOS transistor device 204 is located on the substrate 200. The MOS transistor device 204 includes the gate 206, the source and drain region 208, and the source and drain region 210. The interconnect structures (e.g., the interconnect structure IS21 and the interconnect structure IS22) are located on the substrate 200. The interconnect structures (e.g., the interconnect structure IS21 and the interconnect structure IS22) electrically connect the base 106 to the source and drain region 208 and electrically connect the emitter 108 to the gate 206. In some embodiments, the interconnect structures located on the substrate 200 may include the interconnect structure IS21 and the interconnect structure IS22. The interconnect structure IS21 is electrically connected to the source and drain region 208. The interconnect structure IS22 is electrically connected to the gate 206. In addition, the interconnect structures may further include the interconnect structure IS23. The interconnect structure IS23 is electrically connected to the source and drain region 210. The base 106 and the source and drain region 208 may be electrically connected to each other by the interconnect structure IS11 and the interconnect structure IS21 bonded to each other. In some embodiments, the interconnect structure IS11 may be directly bonded to the interconnect structure IS21. The emitter 108 and the gate 206 may be electrically connected to each other by the interconnect structure IS12 and the interconnect structure IS22 bonded to each other. In some embodiments, the interconnect structure IS12 may be directly bonded to the interconnect structure IS22.

The semiconductor structure 10 may further include the semiconductor dielectric layer 126 and the dielectric layer 214. The dielectric layer 126 is located on the substrate 100. A portion of the interconnect structure IS11 and a portion of the interconnect structure IS12 may be located in the dielectric layer 126. The dielectric layer 214 is located on the substrate 200. The interconnect structure IS21, the interconnect structure IS22, and the interconnect structure IS23 may be located in the dielectric layer 214. The dielectric layer 126 and the dielectric layer 214 may be bonded to each other. In some embodiments, the dielectric layer 126 may be directly bonded to the dielectric layer 214.

The semiconductor structure 10 may further include the semiconductor dielectric layer 128, the passivation layer 130, the interconnect structure IS14, the interconnect structure IS15, and the interconnect structure IS16. The dielectric layer 128 is located on the second surface S2. The interconnect structure IS13 is located in the dielectric layer 128. The passivation layer 130 is located on the dielectric layer 128. The interconnect structure IS14 is located in the passivation layer 130 and electrically connected to the interconnect structure IS11. The interconnect structure IS15 is located in the passivation layer 130 and electrically connected to the interconnect structure IS12. The interconnect structure IS16 is located in the passivation layer 130 and electrically connected to the interconnect structure IS13. In addition, the passivation layer 130 may have the opening OP2, the opening OP3, and the opening OP4. The opening OP2 exposes the interconnect structure IS14. The opening OP3 exposes the interconnect structure IS 15. The opening OP4 exposes the interconnect structure IS16.

The rest explanation of the semiconductor structure 10 may be derived from the descriptions provided in the previous embodiment and will not be repeated hereinafter.

According to one or more embodiments provided above, in the semiconductor structure 10 and the manufacturing method thereof, the semiconductor structure 10 includes the HBT device 102 located on the substrate 100 and the MOS transistor device 204 located on the substrate 200, the base 106 is electrically connected to the source and drain region 208, and the emitter 108 is electrically connected to the gate 206. Therefore, the HBT device 102 and the MOS transistor device 204 may be stacked and electrically connected to each other, whereby the size of the semiconductor structure 10 may be effectively reduced.

In addition, the interconnect structure IS11, the interconnect structure IS12, and the interconnect structure IS13 are electrically connected to the base 106, the emitter 108, and the collector 104, respectively. The interconnect structure IS11 is located on the first surface S1 and extends to the second surface S2, the interconnect structure IS12 is located on the first surface S1 and extends to the second surface S2, and the interconnect structure IS13 is located on the second surface S2. Accordingly, the size of the HBT device 102 may be reduced, and the resistance of the collector 104, the capacitance between the collector 104 and the substrate 100, the capacitance between the interconnect structure IS11 and the interconnect structure IS13, and the capacitance between the interconnect structure IS12 and the interconnect structure IS13 may be reduced as well. As such, the performance of the HBT device 102 and the overall performance of the semiconductor structure 10 are enhanced. In some embodiments, in case that the collector 104 extends from the first surface S1 of the substrate 100 to the second surface S2 of the substrate 100, the capacitance between the collector 104 and the substrate 100 may be eliminated.

In addition, since the HBT device 102 and the MOS transistor device 204 may be respectively formed on the substrate 100 and the substrate 200, the manufacturing process of the HBT device 102 and the manufacturing process of the MOS transistor device 204 do not affect each other. Therefore, the HBT device 102 and the MOS transistor device 204 may be adjusted to the optimal condition, respectively, so as to further improve the performance of the HBT device 102, the performance of the MOS transistor device 204, and the overall performance of the semiconductor structure 10.

To sum up, in the semiconductor structure and the manufacturing method thereof provided in one or more of the embodiments of the disclosure, the size of the semiconductor structure may be effectively reduced, and the overall performance of the semiconductor structure may be improved. Besides, in the semiconductor structure and the manufacturing method thereof provided in one or more of the embodiments of the disclosure, the HBT device and the MOS transistor device may be respectively adjusted to the optimal condition, so as to further enhance the performance of the HBT device and the performance of the MOS transistor device.

It will be apparent to those skilled in the art that various modifications and variations may be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A semiconductor structure, comprising:
a first substrate, having a first surface and a second surface opposite to each other;
a heterojunction bipolar transistor device, located on the first substrate and comprising a collector, a base, and an emitter;
a first interconnect structure, electrically connected to the base, wherein the first interconnect structure is located on the first surface and extends to the second surface;
a second interconnect structure, electrically connected to the emitter, wherein the second interconnect structure is located on the first surface and extends to the second surface;
a third interconnect structure, located on the second surface and electrically connected to the collector;
a second substrate;
a metal oxide semiconductor transistor device, located on the second substrate and comprising a gate, a first source and drain region, and a second source and drain region; and
a plurality of interconnect structures, located on the second substrate, wherein the interconnect structures electrically connect the base to the first source and drain region and electrically connect the emitter to the gate.

2. The semiconductor structure according to claim 1, wherein the collector extends from the first surface to the second surface.

3. The semiconductor structure according to claim 1, wherein the first interconnect structure is connected to the base on the first surface.

4. The semiconductor structure according to claim 1, wherein the second interconnect structure is connected to the emitter on the first surface.

5. The semiconductor structure according to claim 1, wherein the third interconnect structure is connected to the collector on the second surface.

6. The semiconductor structure according to claim 1, wherein the interconnect structures comprise:
a fourth interconnect structure, electrically connected to the first source and drain region; and
a fifth interconnect structure, electrically connected to the gate, wherein
the base and the first source and drain region are electrically connected to each other by the first interconnect structure and the fourth interconnect structure bonded to each other, and
the emitter and the gate are electrically connected to each other by the second interconnect structure and the fifth interconnect structure bonded to each other.

7. The semiconductor structure according to claim 6, wherein
the first interconnect structure is directly bonded to the fourth interconnect structure, and
the second interconnect structure is directly bonded to the fifth interconnect structure.

8. The semiconductor structure according to claim 6, further comprising:
a first dielectric layer, located on the first substrate, wherein a portion of the first interconnect structure and a portion of the second interconnect structure are located in the first dielectric layer; and
a second dielectric layer, located on the second substrate, wherein the fourth interconnect structure and the fifth interconnect structure are located in the second dielectric layer.

9. The semiconductor structure according to claim 8, wherein the first dielectric layer and the second dielectric layer are bonded to each other.

10. The semiconductor structure according to claim 8, wherein the first dielectric layer is directly bonded to the second dielectric layer.

11. The semiconductor structure according to claim 6, wherein the interconnect structures further comprise:
a sixth interconnect structure, electrically connected to the second source and drain region.

12. The semiconductor structure according to claim 1, wherein the second substrate comprises a semiconductor-on-insulator substrate.

13. The semiconductor structure according to claim 1, further comprising:
an isolation structure, located in the first substrate, wherein
the first interconnect structure passes through the isolation structure, and
the second interconnect structure passes through the isolation structure.

14. The semiconductor structure according to claim 1, further comprising:
a dielectric layer, located on the second surface, wherein the third interconnect structure is located in the dielectric layer;
a passivation layer, located on the dielectric layer;
a fourth interconnect structure, located in the passivation layer and electrically connected to the first interconnect structure;
a fifth interconnect structure, located in the passivation layer and electrically connected to the second interconnect structure; and
a sixth interconnect structure, located in the passivation layer and electrically connected to the third interconnect structure.

15. The semiconductor structure according to claim 14, wherein
the passivation layer has a first opening, a second opening, and a third opening,
the first opening exposes the fourth interconnect structure,
the second opening exposes the fifth interconnect structure, and
the third opening exposes the sixth interconnect structure.

16. A manufacturing method of a semiconductor structure, comprising:
providing a first substrate, wherein the first substrate has a first surface and a second surface opposite to each other;
forming a heterojunction bipolar transistor device on the first substrate, wherein the heterojunction bipolar transistor device comprises a collector, a base, and an emitter;
forming a first interconnect structure on the first surface, wherein the first interconnect structure is electrically connected to the base and extends to the second surface;
forming a second interconnect structure on the first surface, wherein the second interconnect structure is electrically connected to the emitter and extends to the second surface;
forming a third interconnect structure on the second surface, wherein the third interconnect structure is electrically connected to the collector;
providing a second substrate;
forming a metal oxide semiconductor transistor device on the second substrate, wherein the metal oxide semiconductor transistor device comprises a gate, a first source and drain region, and a second source and drain region; and forming a plurality of interconnect structures on the second substrate, wherein the interconnect structures electrically connect the base to the first source and drain region and electrically connect the emitter to the gate.

17. The manufacturing method according to claim 16, wherein a method of forming the interconnect structures comprises:

forming a fourth interconnect structure, wherein the fourth interconnect structure is electrically connected to the first source and drain region; and forming a fifth interconnect structure, wherein the fifth interconnect structure is electrically connected to the gate.

18. The manufacturing method according to claim 17, further comprising:

bonding the first interconnect structure and the fourth interconnect structure and electrically connecting the base to the first source and drain region; and bonding the second interconnect structure and the fifth interconnect structure and electrically connecting the emitter to the gate.

19. The manufacturing method according to claim 18, further comprising:

forming a first dielectric layer on the first substrate, wherein a portion of the first interconnect structure and a portion of the second interconnect structure are located in the first dielectric layer;

forming a second dielectric layer on the second substrate, wherein the fourth interconnect structure and the fifth interconnect structure are located in the second dielectric layer; and bonding the first dielectric layer and the second dielectric layer.

20. The manufacturing method according to claim 19, wherein a method of bonding the first interconnect structure and the fourth interconnect structure, bonding the second interconnect structure and the fifth interconnect structure, and bonding the first dielectric layer and the second dielectric layer comprises hybrid bonding.

* * * * *